US008902011B2

(12) United States Patent
Su et al.

(10) Patent No.: US 8,902,011 B2
(45) Date of Patent: Dec. 2, 2014

(54) SIGNAL GENERATING CIRCUIT FOR REAL TIME CLOCK DEVICE AND METHOD THEREOF

(71) Applicant: Alchip Technologies, Ltd., Taipei (TW)

(72) Inventors: Wen-Hong Su, Taipei (TW); Zen-Chuan Lin, Taipei (TW)

(73) Assignee: Alchip Technologies, Ltd., Taipei (TW)

( * ) Notice: Subject to any disclaimer, the term of this patent is extended or adjusted under 35 U.S.C. 154(b) by 35 days.

(21) Appl. No.: 13/728,244

(22) Filed: Dec. 27, 2012

(65) Prior Publication Data
US 2013/0265116 A1    Oct. 10, 2013

(30) Foreign Application Priority Data

Apr. 10, 2012   (TW) .............................. 101112693 A (51) Int. Cl.
| | |
|---|---|
| *H03B 5/32* | (2006.01) |
| *H03L 1/00* | (2006.01) |
| *H03L 5/00* | (2006.01) |
| *H03B 28/00* | (2006.01) |
| *H03L 3/00* | (2006.01) |

(52) U.S. Cl.
CPC . *H03B 28/00* (2013.01); *H03L 3/00* (2013.01)
USPC ............................ 331/158; 331/183; 331/186

(58) Field of Classification Search
USPC ........... 331/116 FE, 116 M, 116 R, 154, 158, 331/160, 182, 183, 185, 186
See application file for complete search history.

(56) References Cited

U.S. PATENT DOCUMENTS

| | | | | |
|---|---|---|---|---|
| 6,118,348 | A  * | 9/2000 | Narahara | 331/116 FE |
| 6,172,575 | B1 * | 1/2001 | Shinmori | 331/116 FE |
| 6,278,338 | B1 * | 8/2001 | Jansson | 331/116 FE |
| 6,411,169 | B1 * | 6/2002 | Yabe et al. | 331/116 FE |
| 6,819,196 | B2 * | 11/2004 | Lovelace et al. | 331/183 |
| 7,030,709 | B2 * | 4/2006 | Novac | 331/158 |
| 7,138,881 | B2 | 11/2006 | Lin | |
| 7,227,426 | B2 * | 6/2007 | Kaizuka | 331/186 |
| 7,348,861 | B1 * | 3/2008 | Wu et al. | 331/158 |
| 7,616,074 | B2 * | 11/2009 | Toffolon et al. | 331/185 |
| 7,859,353 | B2 * | 12/2010 | Liu et al. | 331/160 |
| 7,948,329 | B2 * | 5/2011 | Lim | 331/160 |
| 8,188,802 | B2 * | 5/2012 | Garcia | 331/185 |
| 8,653,901 | B2 * | 2/2014 | Tsai et al. | 331/160 |

FOREIGN PATENT DOCUMENTS

| | | |
|---|---|---|
| TW | I220813 | 9/2004 |
| TW | I314816 | 9/2009 |

* cited by examiner

*Primary Examiner* — Levi Gannon
(74) *Attorney, Agent, or Firm* — Birch, Stewart, Kolasch & Birch, LLP (57) ABSTRACT

A signal generating circuit for a real time clock device is disclosed, having an oscillating circuit, a voltage detecting circuit, and a control circuit. The oscillating circuit is used for generating oscillating signals. The voltage detecting circuit is used for detecting a voltage level coupled with the signal generating circuit. The control circuit is coupled with the oscillating circuit and the voltage detecting circuit. When the voltage level detected by the voltage detecting circuit locates in a predetermined range, the control circuit configures the oscillating circuit to generate the oscillating signals with a larger current at a first interval and to generate the oscillating signals with a smaller current at a second interval. The control circuit further generates a clock signal according to the oscillating signals at a third interval.

10 Claims, 6 Drawing Sheets

SIGNAL GENERATING CIRCUIT FOR REAL TIME CLOCK DEVICE AND METHOD THEREOF

CROSS-REFERENCE TO RELATED APPLICATIONS

This application claims the benefit of priority to Patent Application No. 101112693, filed in Taiwan on Apr. 10, 2012; the entirety of which is incorporated herein by reference for all purposes.

BACKGROUND

The disclosure generally relates to a real time clock device and, more particularly, to the signal generating circuit for the real time clock device.

The real time clock device may be used to generate a signal indicating the current time (referred to as "the real time signal" hereinafter for conciseness). The real time clock devices possess the advantage of low power consumption and therefore are widely utilized in computers, cameras, mobile phones, and other electronic devices.

The real time clock device relies on a signal generating circuit and a signal processing circuit for generating the real time signal. For example, the signal generating circuit may generate a 32.768 KHz oscillating signal as a clock signal. The signal processing circuit may generate the real time signal according to the 32.768 KHz oscillating signal. The signal processing circuit may also generate a power on reset (POR) signal for resetting the circuit elements in the real time clock device after the power is normally supplied so that the real time clock device may operate correctly.

As the trends of energy conservation and environmental protection become prominent, many electronic devices are required to consume less and less power. The real time clock device, which continuously operates to generate the real time signal, must therefore improve the energy consumption efficiency. For example, some signal generating circuit operates with lower voltages or currents to conserve power. The signal generating circuit operating under lower voltages or currents usually suffers from the longer startup time and the instability caused by the noises, and therefore generates erroneous clock signals. The real time clock device may not generate the correct real time signal and may not even function at all.

Moreover, the signal generating circuit operating with lower voltages or currents may often need to be restarted because of the instability caused by the noises. When a simple resistor-capacitor circuit is used to generate the POR signal, the circuit may not generate the POR signal in suitable time because of the frequently occurred restarts. The circuit elements in the real time clock device may not be reset appropriately and therefor the real time clock device may not function correctly.

SUMMARY

In view of the foregoing, it can be appreciated that a substantial need exists for methods and apparatuses that can mitigate or reduce the problems above.

An example embodiment of a signal generating circuit for a real time clock device, comprising: an oscillating circuit for generating an oscillating signal; a voltage detecting circuit, for detecting a voltage level coupled with the signal generating circuit; and a control circuit, coupled with the oscillating circuit and the voltage detecting circuit, for configuring the oscillating circuit to generate the oscillating signal with a first current in a first interval when the voltage level detected by the voltage level detecting circuit locates in a predetermined range, for configuring the oscillating circuit to generating the oscillating signal with a second current in a second interval, and for generating a clock signal according to the oscillating signal in a third interval; wherein the first interval is earlier than the second interval; the second interval is earlier than the third interval; and the second current is smaller than the first current.

Another example embodiment of a signal generating method for a real time clock device, comprising: configuring a voltage detecting circuit to detect whether a voltage level coupled with the real time clock device locates in a predetermined range; configuring an oscillating circuit to generate an oscillating signal with a first current in a first interval; configuring the oscillating circuit to generate the oscillating signal with a second current in a second interval; and generating a clock signal according to the oscillating signal in a third interval; wherein the first interval is earlier than the second interval; the second interval is earlier than the third interval; and the second current is smaller than the first current.

It is to be understood that both the foregoing general description and the following detailed description are example and explanatory only and are not restrictive of the invention, as claimed.

DETAILED DESCRIPTION

Reference is made in detail to embodiments of the invention, which are illustrated in the accompanying drawings.

Figure 1:
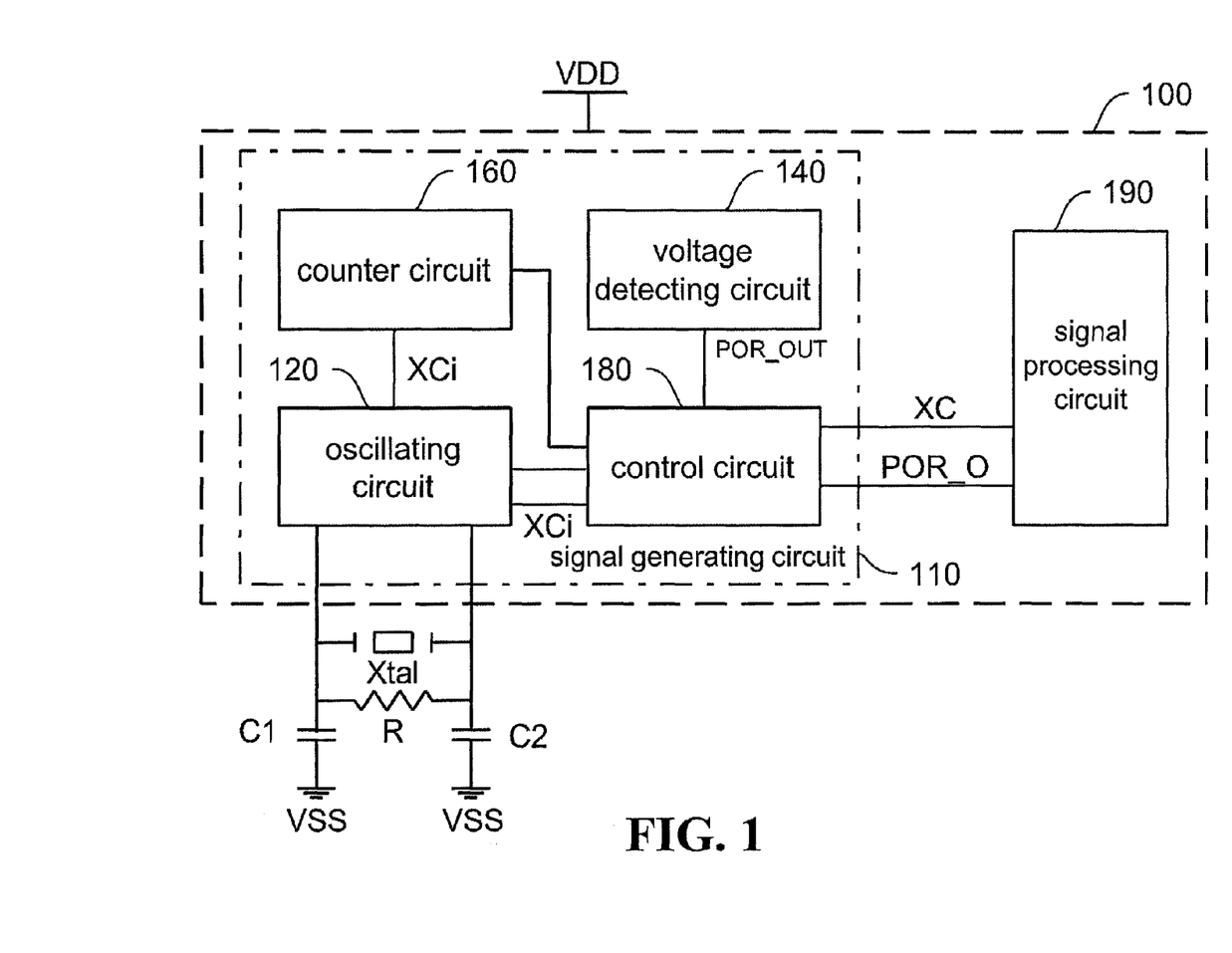
FIG. 1 shows a simplified functional block diagram of a real time clock device according to an embodiment of the present disclosure.

FIG. 1 shows a simplified functional block diagram of a real time clock device 100 according to an embodiment of the present disclosure. The real time clock device 100 comprises a signal generating circuit 110 and a signal processing circuit 190. The real time clock device 100 is coupled with voltage levels VDD and VSS, e.g., the voltage levels of 3.3 volt and the ground. The signal generating circuit 110 comprises an oscillating circuit 120, a voltage detecting circuit 140, a counter circuit 160, and a control circuit 180. The signal generating circuit 110 may be used to generate a clock signal XC and a reset signal POR_O. The clock signal XC and the reset signal POR_O are transmitted to the signal processing circuit 190 so that the signal processing circuit 190 may generate a signal indicating the current time (not show in FIG. 1). In FIG. 1, some components and connections of the real time clock device 100 are omitted for the purposes of conciseness and easier explanation.

Figure 2:
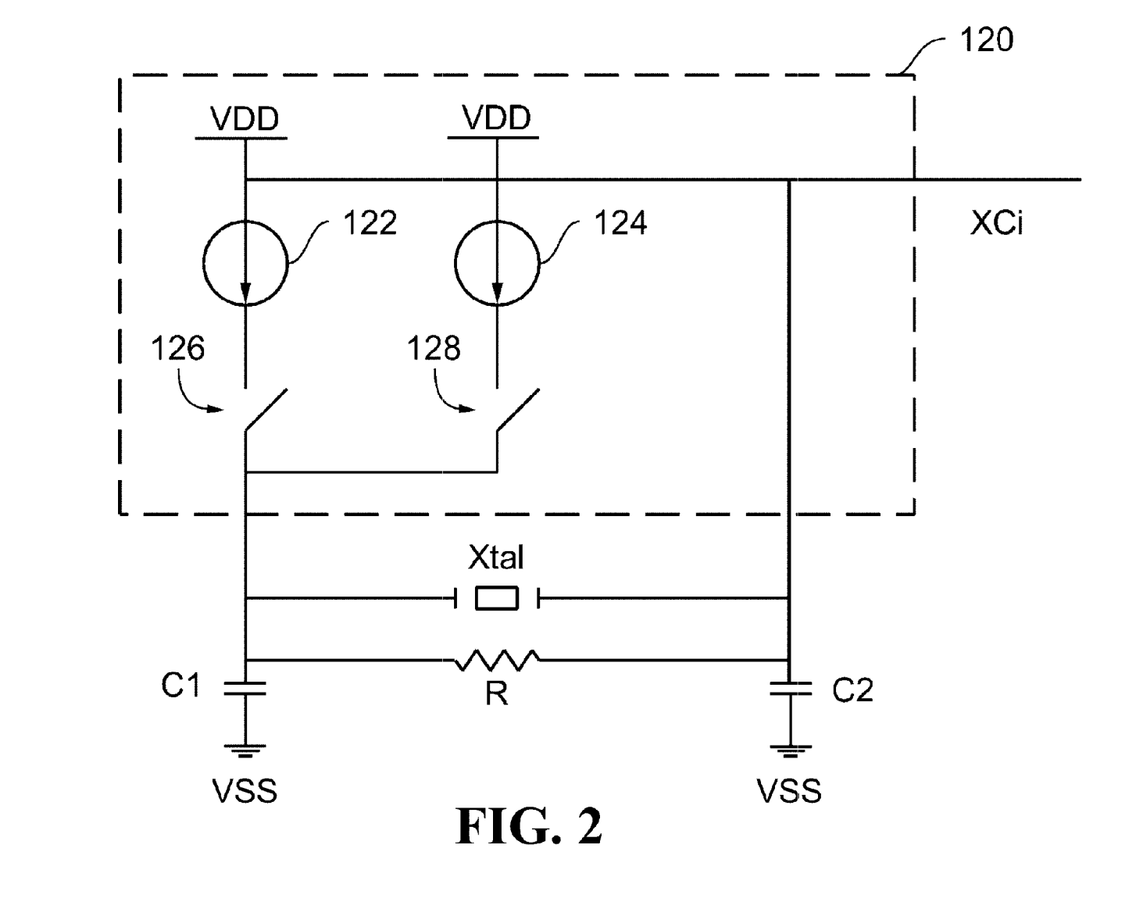
FIG. 2 shows a simplified functional block diagram of an oscillating circuit in FIG. 1 according to an embodiment of the present disclosure.

In the present embodiment, the oscillating circuit 120 is coupled with a crystal oscillator Xtal, capacitors C1 and C2, and a resistor R for generating a 32.768 KHz oscillating signal XCi. FIG. 2 shows a simplified functional block diagram of the oscillating circuit 120 according to an embodiment of the present disclosure. The oscillating circuit 120 comprises current source circuits 122 and 124 and switches 126 and 128. In FIG. 2, some components and connections of the oscillating circuit 120 are omitted for the purposes of conciseness and easier explanation. The control circuit 180 may configure at least one of the conduction statuses of the switches 126 and 128 so that at least one of the currents of the current source circuit 122 and 124 may be transmitted to the crystal oscillator Xtal, the capacitors C1 and C2, and the resistor R. Thus, the oscillating circuit 120 may generate the 32.768 KHz oscillating signal XCi with at least two different current values.

In the embodiment in FIG. 1, the voltage detecting circuit 140 may be used to detect whether the voltage level VDD locates in a predetermined range. The voltage detecting circuit 140 may also notify the control circuit 180 the status of the voltage level VDD so that the control circuit 180 may take corresponding measures. For example, in one embodiment, when the voltage level VDD locates in a predetermined range between 3 volt and 3.6 volt, the voltage detecting circuit 140 configures the notification signal POR_OUT to be active (e.g., to be in the high voltage level) to notify the control circuit 180 that the voltage level VDD locates in the predetermined range. When the voltage level VDD does not locate in the predetermined range between 3 volt and 3.6 volt, the voltage detecting circuit 140 configures the notification signal POR_OUT to be inactive (e.g., to be in the low voltage level) to notify the control circuit 180 that the voltage level VDD does not locate in the predetermined range. The control circuit 180 may therefore perform the reset operation of the oscillating circuit 120 and other operations.

Figure 3:
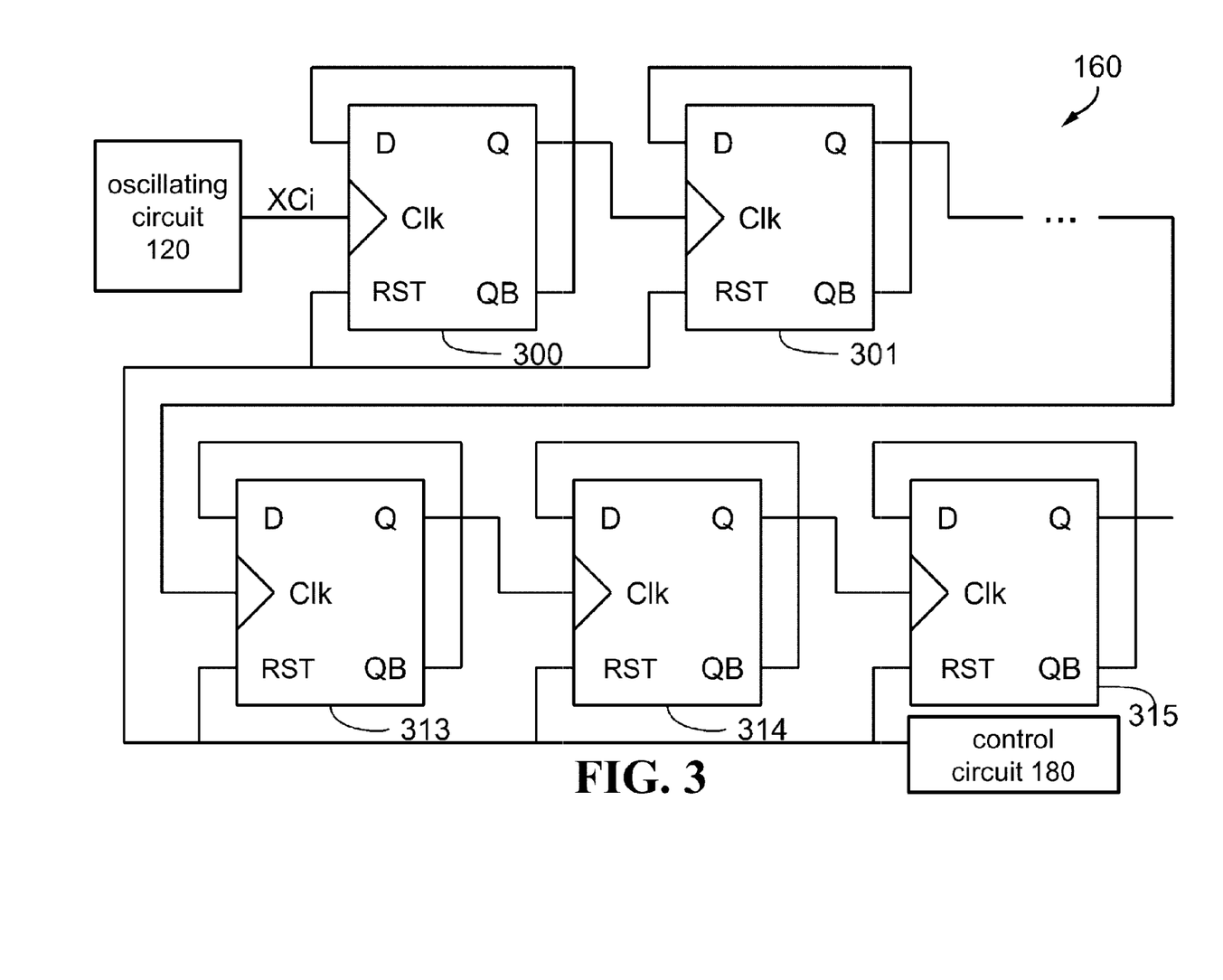
FIG. 3 shows a simplified functional block diagram of a counter circuit in FIG. 1 according to an embodiment of the present disclosure.

The counter circuit 160 may be used to receive the oscillating signal XCi for calculating one or more time values. The counter circuit 160 may be realized with any suitable active and/or inactive circuit elements. For example, FIG. 3 shows a simplified functional block diagram of a counter circuit 160 in FIG. 1 according to an embodiment of the present disclosure. The counter circuit 160 comprises 16 D flip-flops (DFFs) 300~315 (only DFFs 300, 301, 313, 314, and 315 are shown in FIG. 3). The input terminal Clk of the DFF 300 is coupled with the oscillating circuit 120 for receiving the oscillating signal XCi. The output terminals Q of the DFFs 300~314 are respectively coupled with the input terminals Clk of the DFFs 301~315. The input terminals RST of the DFFs 300~315 are coupled with the control circuit 180. The input terminals D of the DFFs 300~315 are respectively coupled with its output terminal QB.

In one embodiment, when the output terminal Q of the DFF 300 is high and the output terminals Q of the DFFs 301~315 are low, it means the time value calculated by the counter circuit 160 is 1/32768 second. When the output terminal Q of the DFF 301 is high and the output terminals Q of the DFFs 300, and 302~315 are low, it means the time value calculated by the counter circuit 160 is 2/32768 second. When the output terminals Q of the DFFs 300~314 are high and the output terminal Q of the DFF 315 is low, it means the time value calculated by the counter circuit 160 is 32767/32768 second (i.e., 1+2+4+ . . . . +8192+16384=32767). When the output terminals Q of the DFFs 300~314 are low and the output terminal Q of the DFF 315 is high, it means the time value calculated by the counter circuit 160 is 1 second (32768/32768 second). Thus, the counter circuit may accurately calculate the time value of the lapsed time according to the oscillating signal XCi. The time value of the counter circuit 160 may be generated by providing one or more values of the output terminals D, the output terminals Q, and/or the output terminals QB of the DFFs 300~315.

The control circuit 180 receives the notification signal POR_OUT of the voltage detecting circuit 140 and configures the oscillating circuit 120 accordingly. When the voltage detecting circuit 140 detects the voltage level VDD locates in the predetermined range and notifies the control circuit 180, the control circuit 180 configures the oscillating circuit 120 to generate the oscillating signal XCi with different current values according to the time value generated by the counter circuit 160. The control circuit 180 may also reset the counter circuit 160 (e.g., by transmitting active high signal to the input terminals RST of the DFFs 300~315) so that the output terminals Q of the counter circuit 160 become low and the counter circuit 160 may re-calculate the time value according to the oscillating signal XCi. For example, in one embodiment, when the real time clock 100 is coupled with the power source and the voltage detecting circuit 140 detects the voltage level VDD locates in the predetermined range, the control circuit 180 configures the oscillating circuit 120 to start generating the oscillating signal XCi and resets the counter circuit 160 to re-calculate the time value. In the operations of the real time clock device 100, when the voltage level VDD is abnormal (e.g., the voltage level VDD does not locate in the predetermined range), the control circuit 180 resets the oscillating circuit 120 to restart and to generate the oscillating circuit XCi and resets the counter circuit 160 to re-calculate the time value.

In this embodiment, the control circuit 180 receives the time value of the counter circuit 160 so as to generate the clock signal XC and/or to configure the reset signal POR_O in appropriate time.

Besides, there may be noises in the oscillating signal XCi. When the noises are transmitted to the signal processing circuit 190, the signal processing circuit 190 may not function correctly. In one embodiment, the control circuit 180 may perform any suitable analog or digital signal processing operations for removing the noises in the oscillating signal XCi and generate the required clock signal XC. For example, the control signal 180 may perform the "AND" operation on the oscillating signal XCi and the other active signal (e.g., a high voltage level signal) with an AND circuit (not shown in FIG. 1) so that the AND circuit may generate a square wave clock signal XC.

The signal processing circuit 190 may be used to generate the real time signal (i.e., the signal indicating the current time) according to the clock signal XC. For example, in one embodiment, the signal processing circuit 190 may store a record indicating the current time in the storage unit (e.g., registers, RAM, volatile memory and/or non-volatile memory; not shown in FIG. 1), and update the record of the storage unit according to the clock signal XC. Accordingly, computers, cameras, mobile phones, and other electronic devices may obtain the current time from the record of the storage unit of the signal processing circuit or from the real time signal provided by the signal processing circuit 190.

Figure 4:
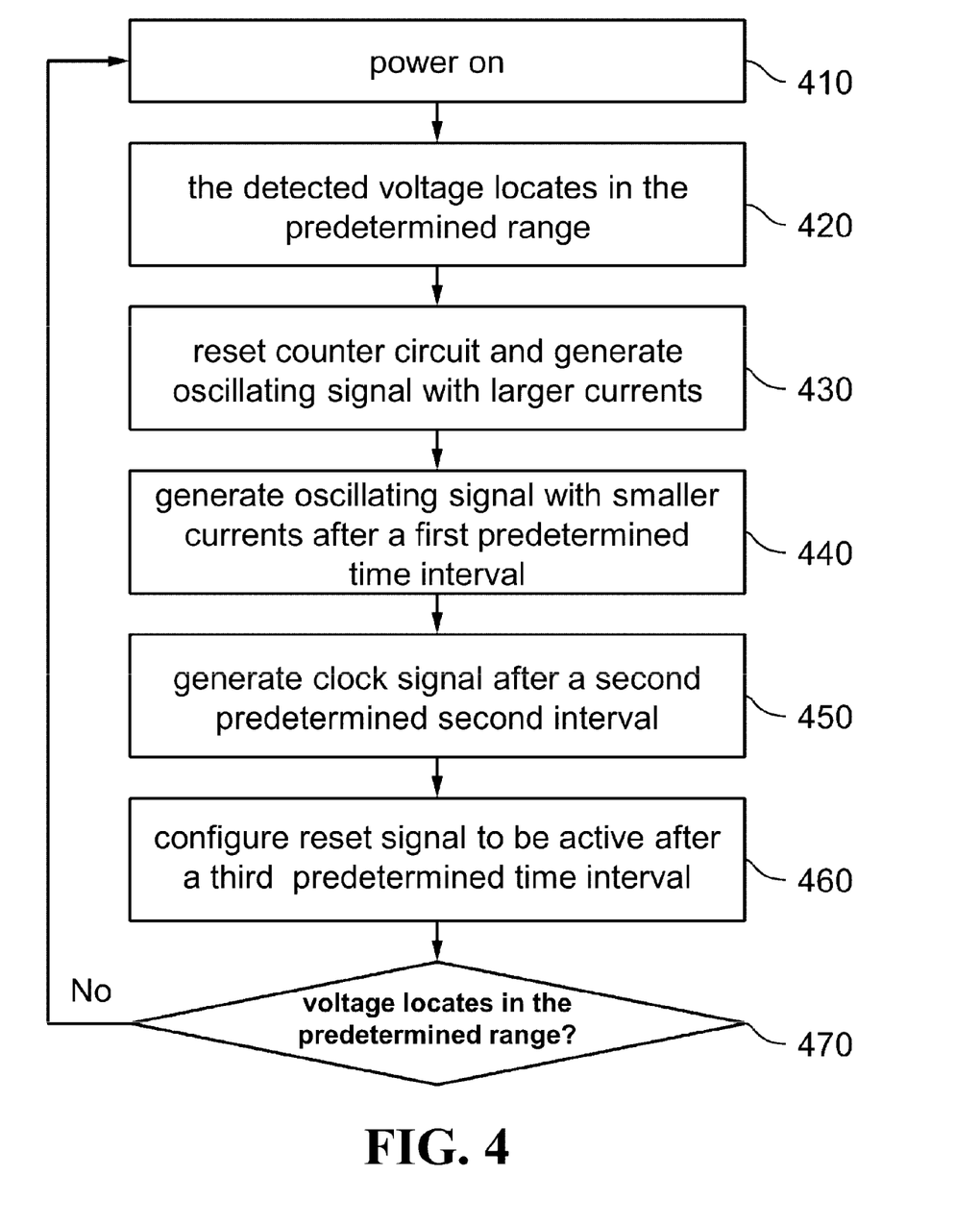
FIG. 4 shows a simplified flowchart of an operating method of the real time clock in FIG. 1 according to an embodiment of the present disclosure.
Figure 5:
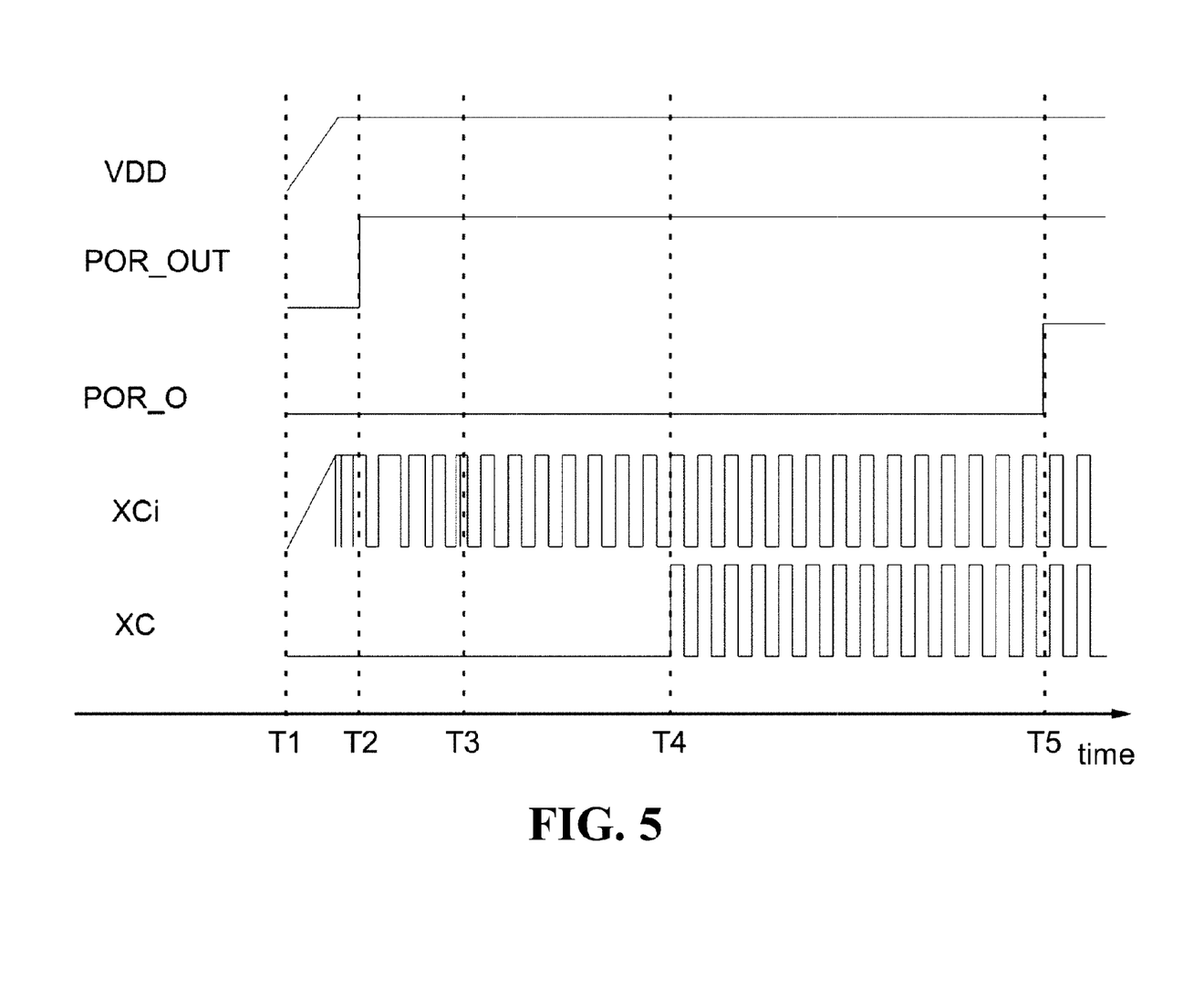
FIGS. 5 and 6 show simplified timing diagrams of several signals generated by the real time clock device in FIG. 1 according to an embodiment of the present disclosure.
Figure 6:
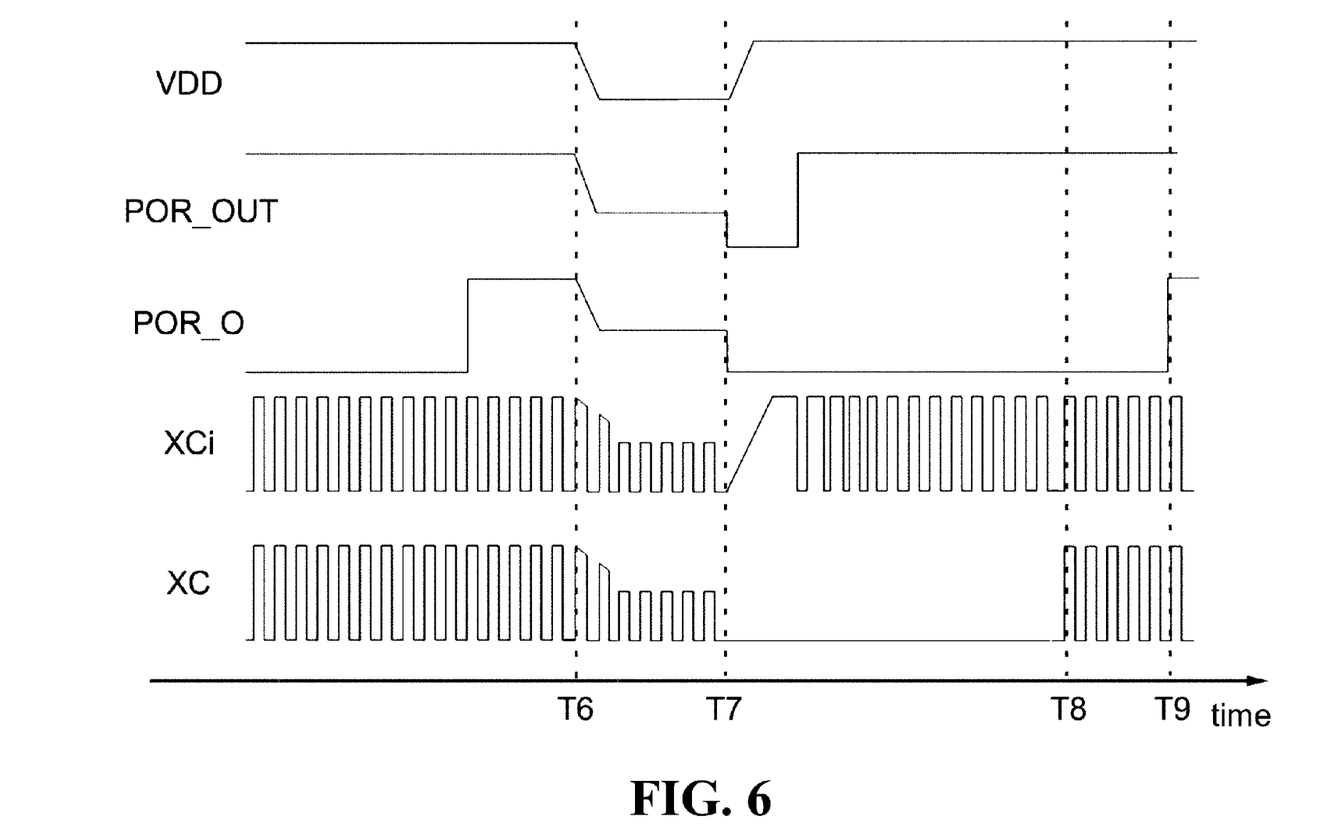

FIG. 4 shows a simplified flowchart of an operating method of the real time clock 100 according to an embodiment of the present disclosure. FIGS. 5 and 6 show simplified timing diagrams of several signals generated by the real time clock device 100 according to an embodiment of the present disclosure. The operations of the real time clock device 100 is further explained below with reference to FIGS. 1~6.

In the operation 410, the real time clock device 100 is powered on. For example, at the time T1 in FIG. 5, the real time clock device 100 is powered on. The voltage level VDD gradually increases and locates in the predetermined range before the time T2.

In the operation 420, the voltage detecting circuit 140 detects the voltage level VDD locates in the predetermined range, and notifies the control circuit 180 that the voltage level VDD locates in the predetermined range. For example, at the time T2 in FIG. 5, the voltage detecting circuit 140 detects the voltage level VDD locates in the predetermined range after a period of detecting time. The voltage detecting circuit 140 configures the notification signal POR_OUT to be active (to be high in the embodiment in FIG. 5) so as to notify the control circuit 180 that the voltage level VDD locates in the predetermined range.

In the operation 430, the control circuit 180 resets the counter circuit 160, and configures the switches 126 and 128 of the oscillating circuit 120 to be conducted. The currents of the current source circuits 122 and 124 may both be transmitted to the crystal oscillator Xtal, the capacitors C1 and C2, and the resistor R so that the oscillating circuit 120 may generate the 32.768 KHz oscillating signal XCi with a larger current to reduce the startup time of the oscillating circuit 120. For example, in the interval between the time T2 and T3 in FIG. 5, the control circuit 180 configures the oscillating circuit 120 to generate the oscillating signal XCi with the currents of the current source circuits 122 and 124.

In the operation 440, the oscillating signal XCi is stable after a first predetermined time interval. The first predetermined time interval may be calculated by the control circuit 180 according to the time value of the counter circuit 160, e.g., the interval between the time T2 and T3 in FIG. 5. Thus, the control 180 may configures one of the switches 126 and 128 to be not conducted so that the oscillating circuit 120 transmits a smaller current (e.g., one of the currents of the current circuits 122 and 124) to the crystal oscillator Xtal, the capacitors C1 and C2, and the resistor R. The oscillating circuit 120 generates the 32.768 KHz oscillating signal with a smaller current (i.e., smaller than the current in the operation 430) to reduce the power consumption. For example, after the first predetermined time interval T2~T3 in FIG. 5, the control circuit 180 configures the oscillating circuit 120 to generate the oscillating signal XCi with the current source circuit 122.

In the operation 450, the control circuit 180 transmits the clock signal XC generated according to the oscillating signal XCi to the signal processing circuit 190 after a second predetermined time interval. The second predetermined time interval may be calculated by the control circuit 180 according to the time value of the counter circuit 160, e.g., the interval between the time T3 and T4 in FIG. 5. For example, after the second predetermined time interval T3~T4 in FIG. 5, the control circuit 180 transmits the clock signal XC generated according to the oscillating signal XCi to the signal processing circuit 190.

In the operation 460, when the control circuit 180 stably provides the clock signal XC to the signal processing circuit 190 after a third predetermined time interval, the control circuit 180 configures the reset signal POR_O to be active for resetting other circuit elements in the real time clock device 100. Therefore, the real time clock device 100 may start generating the real time signal. The third predetermined time interval may be calculated by the control circuit 180 according to the time value of the counter circuit 160, e.g., the interval between the time T4 and T5 in FIG. 5. For example, after the third predetermined time interval T4~T5 in FIG. 5, the control circuit 180 configures the reset signal POR_O to be active (to be high in the embodiment in FIG. 5) for resetting other circuit elements in the real time clock device 100.

In the operation 470, the voltage detecting circuit 140 keeps monitoring the voltage level VDD. When the voltage level VDD does not locate in the predetermined range, the voltage detecting circuit 140 notifies the control circuit 180 that the voltage level VDD does not locate in the predetermined range. The operating method goes back to the operation 410 to repeat the operations 410~460 for generating the clock signal XC and the reset signal POR_O. Thus, when the real time clock device 100 is influenced by the noises, the real time clock device 100 may still resume normal function with the operating method above. For example, in FIG. 6, when the real time clock device 100 operates for a period of time, the voltage level VDD becomes unstable after the time T6. After a period of detecting time, the voltage detecting circuit 140 configures the notification signal POR_OUT to be inactive (to be low in the embodiment in FIG. 5) at the time T7 so as to notify the control circuit 180 that the voltage level VDD does not locate in the predetermined range. The control circuit 180 starts to repeat the operations 410~460 at the time T7. The control circuit 180 may therefore continue to provide the clock signal XC at the time T8 and configure the reset signal POR_O to be active at the time T9. The real time clock device 100 may therefore resume the normal function.

In other embodiments, the crystal oscillator Xtal may also be replaced with the oscillator realized with resistors, capacitors, inductors, and/or other circuit elements, e.g., the RC oscillator and the LC oscillator.

In other embodiments, the oscillating circuit 120 may also be configured to generate the oscillating signal XCi of 16.384 KHz, 65.536 KHz, or other suitable frequencies.

In other embodiments, the oscillating circuit 120 may comprises one or more current source circuits for generating several current values. In other embodiments, the switches 126 and 128 may be omitted, and the control circuit 180 configures the current value(s) of the current source circuit(s) of the oscillating circuit 120 by adjusting the voltage(s) and/or current(s) of the control signal(s) to the current source circuit(s).

In other embodiments, the number of the DFFs in the counter circuit 160 in FIG. 3 may be configured according to the required range of the time value and the frequency of the oscillating frequency XCi. Moreover, the counter circuit 160 may also be realized with other structures, e.g., the processor, the microcontroller, digital circuit elements, analog circuit elements, and/or storage units.

In other embodiments, the operations in FIG. 4 may be configured according to different design considerations. For example, the order of executing the operation 450 and the operation 460 may be interchanged, or the operation 450 and the operation 460 may be executed at the same time. In one embodiment, the control circuit 180 may generate the clock signal XC and configure the reset signal POR_O to be active at the same time. In another embodiment, the control circuit 180 may configure the reset signal POR_O to be active before generating the clock signal XC.

In other embodiments, when the reset signal POR_O in the real time clock device 100 is generated by other device, the operation 460 and the relevant hardware, firmware, software of the control circuit 180 may be omitted.

In other embodiments, if the oscillating signal XCi does not have noise or has a negligible noise (e.g., in the shape of the square wave), the control circuit 180 may omit the signal processing operations on the oscillating signal XCi and directly provide the oscillating signal XCi as the clock signal XC.

In the embodiments above, the signal generating circuit 110, the oscillating circuit 120, the voltage detecting circuit 140, the counter circuit 160, the control circuit 180, the signal processing circuit 190, and the components therein may be respectively realized with digital circuit elements, analog circuit elements, processors, hardware, firmware, software, and the combination thereof. For example, the functional blocks above may be realized with a single integrated circuit (IC), one or more IC elements, and/or one or more discrete circuit element.

In the embodiments above, the signal generating circuit 110 may generate the oscillating signal with a larger current first for generating the oscillating signal quickly. Later on, the signal generating circuit 110 may continue generating the oscillating signal with a smaller current for conserving power. Therefore, the startup time and the power consumption of the real time clock device 100 may be reduced.

In the embodiments above, when the signal generating circuit 100 generates the oscillating signal with a smaller current to conserve power, the voltage detecting circuit 140 may continuously monitor the voltage level VDD. When the voltage level VDD is disturbed and the clock signal XC is affected, the control circuit 180 may configures the signal generating circuit 110 to restart the operating method in FIG. 4 so as to quickly resume providing the clock signal XC and the reset signal POR_O. The real time clock device 100 may therefore quickly resume normal function.

Furthermore, the control circuit 180 may accurately calculate the lapsed time by utilizing the oscillating circuit 120 and the counter circuit 160. The control circuit 180 may therefore configures the oscillating circuit 120 and the counter circuit 160 to perform the required operations at appropriate time to generate the clock signal XC and/or to configure the reset signal POR_O. In the embodiments above, the circuit for generating the reset signal POR_O is integrated to save the hardware complexity and to provide the reset signal POR_O at the required time. The design of the real time clock device 100 is therefore more flexible.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

The same reference numbers may be used throughout the drawings to refer to the same or like parts, components, or operations. Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to . . . ." Also, the phrase "coupled with" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a", "an", and "the" herein are intended to comprise the plural forms as well, unless the context clearly indicates otherwise. In the embodiments above, the signals are represented as active high signals for easier explanation. In other embodiments, the signals may be respectively represented as active high signals and active low signal.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A signal generating circuit for a real time clock device, comprising:
    an oscillating circuit for generating an oscillating signal;
    a voltage detecting circuit, for detecting a voltage level coupled with the signal generating circuit;
    a control circuit, coupled with the oscillating circuit and the voltage detecting circuit, for configuring the oscillating circuit to generate the oscillating signal with a first current in a first interval when the voltage level detected by the voltage level detecting circuit locates in a predetermined range, for configuring the oscillating circuit to generating the oscillating signal with a second current in a second interval, and for generating a clock signal according to the oscillating signal in a third interval; and
    a counter circuit, coupled with the oscillating circuit and the control circuit, for calculating a time value according to the oscillating signal,
    wherein when the voltage detecting circuit detects that the voltage level does not locate in the predetermined range after the third interval, the control circuit configures the oscillating circuit to generate the oscillating signal with the first current in a fourth interval, configures the oscillating circuit to generating the oscillating signal with the second current in a fifth interval, and generates the clock signal according to the oscillating signal in a sixth interval; the first interval is earlier than the second interval; the fourth interval is earlier than the fifth interval; the fifth interval is earlier than the sixth interval; the second interval is earlier than the third interval; and the second current is smaller than the first current, the control circuit calculating lapsed times of the first interval, the second interval, the third interval, the fourth interval, the fifth interval and the sixth interval according to the time value.

2. The signal generating circuit of claim 1, wherein the control circuit generates a reset signal in a seventh interval for resetting the real time clock device; and the seventh interval is later than the third interval.

3. The signal generating circuit of claim 2,
    wherein the control circuit calculating lapsed times of the first interval, the second interval, the third interval, the fourth, the fifth interval, the sixth interval and the seventh interval according the time value.

4. The signal generating circuit of claim 3, wherein the control circuit resets the time value of the counter circuit before the first interval and the fourth interval.

5. The signal generating circuit of claim 1, wherein the control circuit resets the time value of the counter circuit before the first interval.

6. A signal generating method for a real time clock device, comprising:
    configuring a voltage detecting circuit to detect whether a voltage level coupled with the real time clock device locates in a predetermined range;
    configuring an oscillating circuit to generate an oscillating signal with a first current in a first interval;

configuring the oscillating circuit to generate the oscillating signal with a second current in a second interval;
generating a clock signal according to the oscillating signal in a third interval;
calculating a time value according to the oscillating signal with a counter circuit;
when the voltage detecting circuit detects that the voltage level does not locate in the predetermined range after the third interval, configuring the oscillating circuit to generate the oscillating signal with the first current in a fourth interval; configuring the oscillating circuit to generating the oscillating signal with the second current in a fifth interval; and generating the clock signal according to the oscillating signal in a sixth interval,
wherein the first interval is earlier than the second interval; the second interval is earlier than the third interval; the fourth interval is earlier than the fifth interval; the fifth interval is earlier than the sixth interval; and the second current is smaller than the first current, and
wherein the control circuit calculating lapsed times of the first interval, the second interval, the third interval, the fourth interval, the fifth interval and the sixth interval according to the time value.

7. The signal generating method of claim 6, further comprising:
generating a reset signal in a seventh interval for resetting the real time clock device;
wherein the seventh interval is later than the third interval.

8. The signal generating method of claim 7,
wherein lapse times of the first interval, the second interval, the third interval, the fourth, the fifth interval, the sixth interval, and the seventh interval are calculated according the time value.

9. The signal generating method of claim 8, wherein the time value of the counter circuit is reset before the first interval and the fourth interval.

10. The signal generating method of claim 6, wherein the time value of the counter circuit is reset before the first interval.

* * * * *